United States Patent
Kienle et al.

(10) Patent No.: US 10,892,207 B2
(45) Date of Patent: Jan. 12, 2021

(54) POWER MODULE

(71) Applicant: Robert Bosch GmbH, Stuttgart (DE)

(72) Inventors: Wolfram Kienle, Magstadt (DE);
Guenter Schelling, Moessingen (DE);
Jan Homoth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 24 days.

(21) Appl. No.: 16/342,284

(22) PCT Filed: Sep. 11, 2017

(86) PCT No.: PCT/EP2017/072737
§ 371 (c)(1),
(2) Date: Apr. 16, 2019

(87) PCT Pub. No.: WO2018/072925
PCT Pub. Date: Apr. 26, 2018

(65) Prior Publication Data
US 2019/0237384 A1    Aug. 1, 2019

(30) Foreign Application Priority Data

Oct. 20, 2016   (DE) .......................... 10 2016 220 553

(51) Int. Cl.
*H01L 25/07*   (2006.01)
*H01L 23/373*   (2006.01)
(Continued)

(52) U.S. Cl.
CPC ...... *H01L 23/3735* (2013.01); *H01L 21/4803* (2013.01); *H01L 21/4846* (2013.01);
(Continued)

(58) Field of Classification Search
CPC ....... H01L 2924/00; H01L 2924/00014; H01L 2924/00012; H01L 2224/32245;
(Continued)

(56) References Cited

U.S. PATENT DOCUMENTS 6,060,150 A     5/2000 Nakatani et al.
7,166,496 B1 *  1/2007 Lopez ................... H01L 21/561
                                         257/E23.044
(Continued)

FOREIGN PATENT DOCUMENTS

DE    102007041921     3/2009
DE    102014206608    10/2015
(Continued)

OTHER PUBLICATIONS

International Search Report for Application No. PCT/EP2017/072737 dated Dec. 18, 2017 (English Translation, 3 pages).

*Primary Examiner* — Jaehwan Oh
(74) *Attorney, Agent, or Firm* — Michael Best & Friedrich LLP

(57) ABSTRACT

For a power module comprising at least three levels stacked one above another, including: at least one heat sink (10) having a top side (11), at least one adhesion-promoting intermediate layer (20) applied to the top side (11) of the heat sink (10) and extending in a planar fashion and having a first side (21), which faces the top side (11) of the heat sink (10), and a second side (22), which faces away from the first side (21), at least one metallic layer (30) arranged on the second side (22) of the intermediate layer (20) and subdivided into conductor track sections (31) and having a contact side (32), which faces the second side (22) of the intermediate layer (20), wherein the power module furthermore comprises at least one electronic power component (40) which is applied to at least one conductor track section (31) of the metallic layer (30) and is electrically contacted electrically with the at least one conductor track section (31) of the metallic layer (30), it is proposed that the metallic layer (30) subdivided into conductor track sections (31) is produced from at least one metal sheet subdivided into (Continued)

conductor track sections (31) independently of the production of the intermediate layer (20) and the heat sink (10).

10 Claims, 2 Drawing Sheets

(51) Int. Cl.
*H01L 23/498* (2006.01)
*H01L 23/14* (2006.01)
*H01L 21/48* (2006.01)
*H01L 25/18* (2006.01)

(52) U.S. Cl.
CPC ........ *H01L 23/145* (2013.01); *H01L 23/3737* (2013.01); *H01L 23/49861* (2013.01); *H01L 25/072* (2013.01); *H01L 25/18* (2013.01); *H01L 2224/45014* (2013.01); *H01L 2224/48472* (2013.01); *H01L 2224/49111* (2013.01)

(58) Field of Classification Search
CPC . H01L 2924/13091; H01L 2924/01029; H01L 23/49562; H01L 2224/16245
See application file for complete search history.

(56) References Cited

U.S. PATENT DOCUMENTS

| | | | | |
|---|---|---|---|---|
| 7,262,973 B2 * | 8/2007 | Nakashima | ........... | H02M 7/003 361/760 |
| 8,130,499 B2 * | 3/2012 | Ohnishi | ................ | H01L 25/162 361/710 |
| 2003/0072136 A1 * | 4/2003 | Suzumura | ......... | H01L 23/49861 361/723 |
| 2007/0063340 A1 * | 3/2007 | Owyang | ................ | H01L 23/36 257/723 |
| 2007/0222044 A1 * | 9/2007 | Otremba | ........... | H01L 23/49833 257/678 |
| 2008/0023807 A1 * | 1/2008 | Noquil | .............. | H01L 23/49575 257/675 |
| 2009/0266584 A1 * | 10/2009 | Tsumura | ............. | H01L 23/3735 174/252 |
| 2010/0208438 A1 * | 8/2010 | Kaltenbacher | ...... | H01L 23/3735 361/760 |
| 2015/0294952 A1 * | 10/2015 | Kimura | ................ | H01L 21/565 438/107 |
| 2015/0332989 A1 * | 11/2015 | Samson | ................. | H01L 24/97 257/670 |
| 2016/0029517 A1 * | 1/2016 | Kim | ................. | H05K 7/20409 361/710 |
| 2016/0218087 A1 * | 7/2016 | Ye | .................... | H01L 23/49575 |
| 2016/0268190 A1 * | 9/2016 | McKnight-MacNeil | | ................... H01L 21/78 |
| 2017/0117162 A1 * | 4/2017 | Busche | ............ | H01L 23/49822 |
| 2017/0151858 A1 * | 6/2017 | Bilhofer | ................ | F24H 9/1863 |
| 2019/0182997 A1 * | 6/2019 | Lin | ........................ | H05K 13/00 |

FOREIGN PATENT DOCUMENTS

| | | |
|---|---|---|
| EP | 1909324 | 4/2008 |
| EP | 2006910 | 12/2008 |

* cited by examiner

POWER MODULE

BACKGROUND OF THE INVENTION

The invention relates to a power module.

Inverter structures and converter structures having commutating circuits comprising intermediate circuit capacitors and half-bridges, which are provided by way of example in power modules, are used in hybrid vehicles or electric vehicles. By way of example, inverters that provide phase currents for the electric machine are used in order to operate an electric machine. The inverters and converters comprise by way of example power modules. The power modules may comprise by way of example a carrier substrate having conductor track sections on which by way of example circuit breakers are arranged, said circuit breakers forming together with the carrier substrate a power module.

The carrier substrate in this case is frequently by way of example a DBC substrate (direct bonded copper, an AMB substrate (active metal brazed) or an IMS substrate (insulated metal substrate). During the production by way of example of a DBC substrate, copper films are fused by way of example onto a ceramic substrate and the metal layer of copper that is applied to the ceramic substrate is subsequently sub-divided into conductor track sections by way of example by means of photolithographic processes. It is possible to provide a further metal layer, by way of example of copper, on the face of the ceramic substrate that is remote from the metal layer that is sub-divided into conductor track sections. In applications using power electronics, this further metal layer of copper is laminated to a cooling body by way of example by interpositioning an electrically insulating intermediate layer.

SUMMARY OF THE INVENTION

In accordance with the invention, a power module is proposed that comprises at least three layers that are stacked one above the other. The three layers comprise at least one cooling body having an upper face, at least one intermediate layer that is applied to the upper face of the cooling body and extends in a manner that is planar and provides an adhesive bond, said intermediate layer having a first face that is facing the upper face of the cooling body and having a second face that is remote from the first face, and at least one metal layer that is arranged on the second face of the intermediate layer and is sub-divided into conductor track sections, said metal layer having a contact face that is facing the second face of the intermediate layer. The power module comprises furthermore at least one electrical and/or electronic power component that is applied to at least one circuit track section of the metal layer and is in electrical contact electrically with the at least one circuit track section of the metal layer. In accordance with the invention, the metal layer that is sub-divided into conductor track sections is produced from at least one metal sheet, which is sub-divided into conductor track sections, independently from the production of the intermediate layer and independently from the production of the cooling body.

In contrast to the prior art, the metal layer in the case of the power module may be divided into conductor track sections prior to applying the metal layer to the upper face of the cooling body of the cooling body. The already provided conductor track sections may then be applied, by way of example laminated, to the front face of the cooling body advantageously in a simple manner by interpositioning the intermediate layer, without it being subsequently necessary to further process the conductor track sections. Consequently, in comparison to the prior art, the power module in accordance with the invention demonstrates a particular simple construction that may be produced in a simple and cost-effective manner. Simple standard processes may be advantageously used to produce the power module in accordance with the invention, as a result of which the power module may be produced in a particularly simple and cost-effective manner. It is not necessary to perform complex and expensive processes by way of example for fusing copper to a ceramic substrate and subsequently sub-dividing the metal layer of copper by way of example by means of a photolithographic method as used in the prior art.

Furthermore, by virtue of the fact that the metal layer that is sub-divided into conductor track sections is produced from at least one metal sheet, which is sub-divided into conductor track sections, independently from the production of the intermediate layer and the production of the cooling body, it is advantageously possible to vary the thickness of the metal sheet and consequently the thickness of the circuit track sections and consequently to advantageously vary the power loss from the conductor track sections. It is by way of example advantageously possible to also configure parts of the circuit track sections in a bent manner. It is thus possible by way of example to configure in a bent manner connection regions of the circuit track sections that are provided so as to provide contact between the power module and other components that are provided outside the power module.

Furthermore, in the power module in accordance with the invention, the circuit track sections are particularly efficiently cooled by virtue of their spatial proximity to the cooling body, only separated by means of the intermediate layer.

Further advantageous embodiments and further developments of the inventions are possible by means of the features disclosed in the subordinate claims.

It is particularly advantageous that the first face of the intermediate layer adheres in a bonded manner to the contact face of the metal layer and/or the second face of the intermediate layer adheres in a bonded manner to the upper face of the cooling body. An intermediate layer of this type connects the metal layer to the cooling body in an advantageously efficient and stable manner.

In one particularly advantageous exemplary embodiment, the circuit track sections are configured as stamped parts. Circuit track sections that are configured as stamped parts may be produced advantageously in a simple manner by way of example from one or multiple metal sheets.

It is of advantage if the circuit track section comprises at least one connection region for providing electrical contact with the circuit track section, wherein the connection region is arranged outside an extension plane of the metal layer in which the metal layer essentially extends. By virtue of a connection region that is arranged outside the extension plane of the metal layer, it is possible, in an advantageously simple and efficient manner and directly without intermediate elements, to provide an electrical contact between the power module and components that are arranged outside the power module. The connection region may thus be arranged by way of example remote from the extension plane of the metal layer and consequently the metal layer in the extension plane and by way of example also the intermediate layer may be advantageously protected against connection technologies, by way of example welding, for providing contact between the connection regions and the components that are arranged outside the power module.

The connection region of the circuit track section may be particularly advantageously bent out of the extension plane of the circuit track section. Consequently, the circuit track sections may be formed by way of example advantageously in a simple manner as stamped/bent parts from one or multiple metal sheets.

In one advantageous exemplary embodiment, the first face of the intermediate layer is laminated to the upper face of the cooling body and/or the second face of the intermediate layer is laminated to the contact face of the metal layer. In so doing, the intermediate layer may be configured advantageously as a laminating film, in particular as a laminating film that is embodied from a synthetic material. Consequently, the circuit track sections may be attached advantageously in a simply and secure manner to the upper face of the cooling body and the laminating film may insulate the circuit track sections advantageously in an electrical manner from the cooling body.

The intermediate layer is particularly advantageously configured in one piece and the intermediate layer lies with the first face directly against the upper face of the cooling body and the intermediate layer lies with the second face directly against the contact face of the metal layer.

Further advantageous is a method for producing a power module wherein the method comprises:
- a step for producing a metal layer that is sub-divided into circuit track sections and is configured from at least one metal sheet,
- a step for applying the metal layer that is sub-divided into circuit track sections to the upper face of the cooling body by interpositioning an intermediate layer that provides an adhesive bond,
- a step for attaching at least one electronic power component to at least one circuit track section of the metal layer and
- a step for providing electrical contact between the electronic power component and the at least one circuit track section of the metal layer.

BRIEF DESCRIPTION OF THE DRAWINGS

An exemplary embodiment of the invention is illustrated in the drawing and will be further explained in the description below. In the drawings.

DETAILED DESCRIPTION

The power module 1 in accordance with the invention may be used in numerous applications, by way of example as an inverter or converter in the automotive industry. By way of example, the electronic circuit unit may also be used as an inverter, called a power inverter, for operating an electric machine by way of example in hybrid or electric vehicles.

Figure 1:
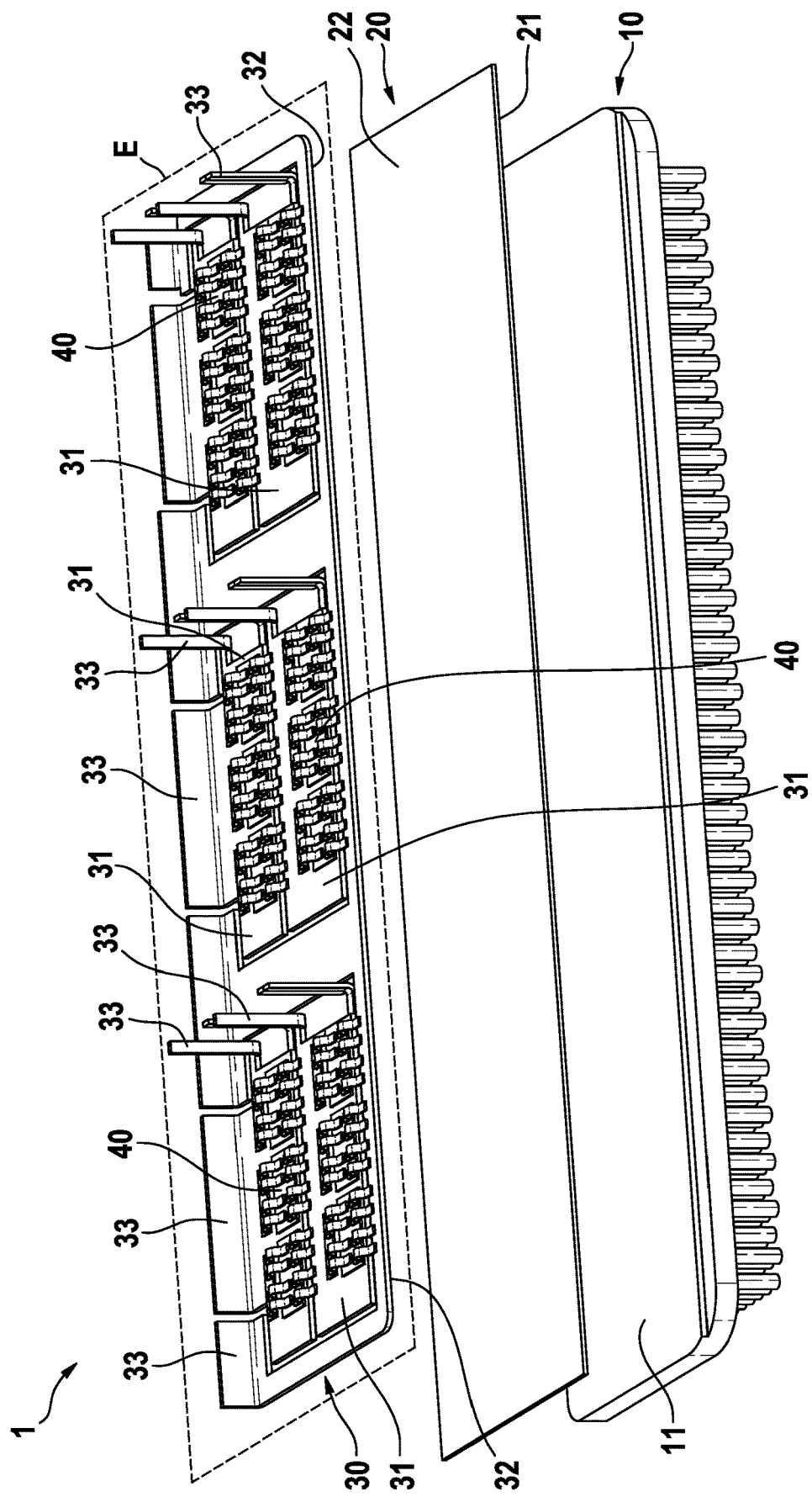
FIG. 1 illustrates a schematic view of an exemplary embodiment of the power module in accordance with the invention.
Figure 2:
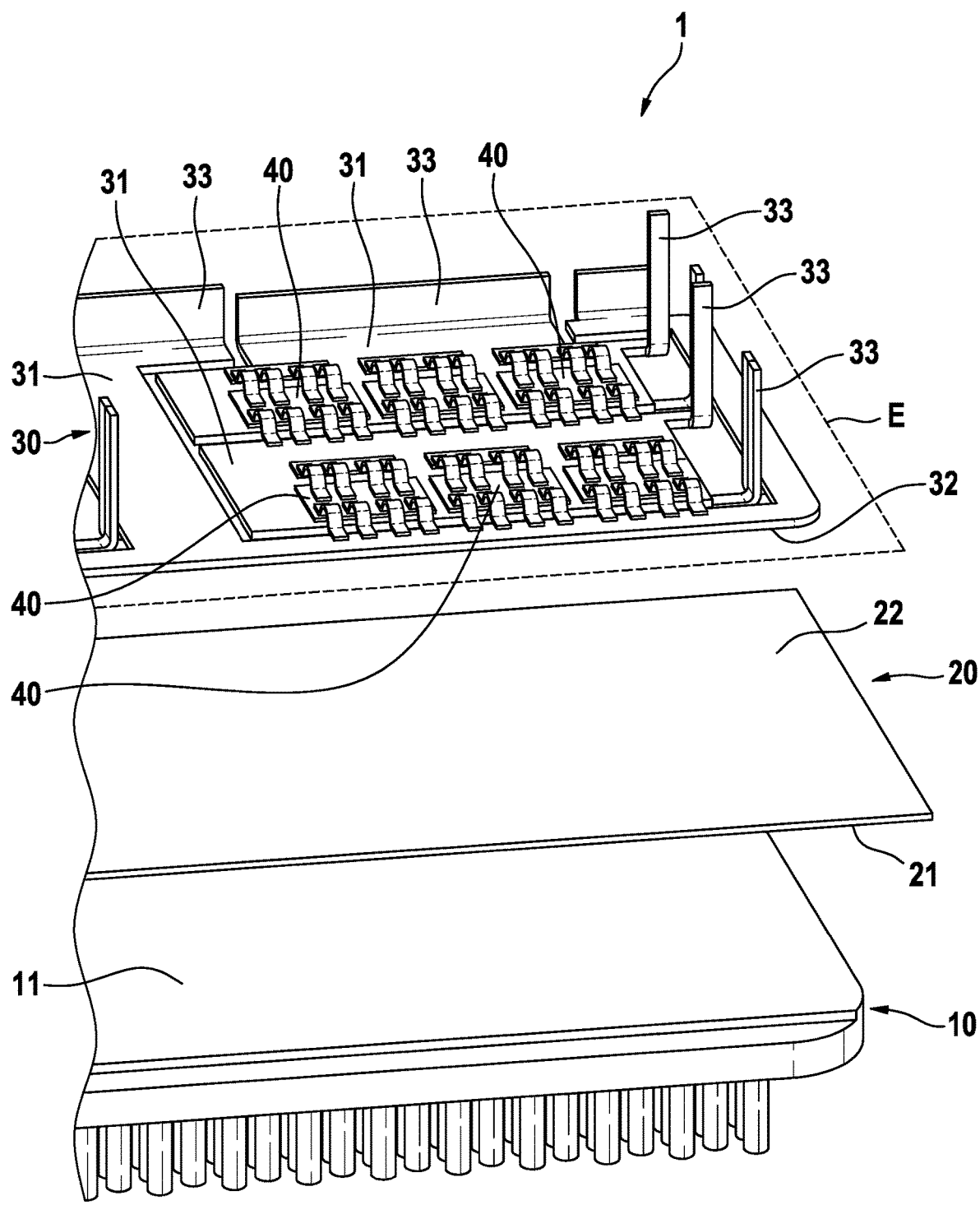
FIG. 2 illustrates an enlarged view of the exemplary embodiment of the power module illustrated in FIG. 1.

FIG. 1 and FIG. 2 illustrate in an exploded view different views of an exemplary embodiment of the power module in accordance with the invention The power module 1 comprises in this exemplary embodiment three layers that are stacked one above the other and together may form a carrier substrate for electrical and/or electronic power components 40.

The power module 1 comprises a layer having a cooling body 10 having an upper face 11. The cooling body 10 is produced from a material that has good thermal conductivity properties, such as by way of example aluminum or copper. The cooling body 10 is configured in this exemplary embodiment essentially as a cooling plate having a planar upper face 11. In order to improve the heat dissipation, by way of example structures are provided on the face of the cooling body 10 that is remote from the upper face 11 of the cooling body 10. By way of example, ribs, pins or ducts may be configured as structures for improving the heat dissipation. In this exemplary embodiment, pins on configured on the cooling body 10 as structures for improving the heat dissipation on the face that is remote from the upper face 11 of the cooling body 10. The upper face 11 of the cooling body 10 is a planar surface in this exemplary embodiment. In this exemplary embodiment, the cooling body 10 comprises in a direction perpendicular to the upper face 11 of the cooling body 10 a thickness that is both greater than a thickness of the intermediate layer 20 in the same direction and also greater than a thickness of the metal layer 30 in the same direction.

The power module 1 comprises furthermore a layer having an intermediate layer 20 that provides an adhesive bond and comprises a first face 21 and a second face 22 that is remote from the first face 21. The intermediate layer 20 that provides an adhesive bond is applied to the upper face 11 of the cooling body 10 and in this exemplary embodiment extends in a planar manner on the upper face 11 of the cooling body 10. The first face 21 of the intermediate layer 20 in this case is facing the upper face 11 of the cooling body 10. The metal layer 30 that is already sub-divided into conductor track sections 31 is laminated to the cooling body 10 by means of the intermediate layer 20. The first face 21 of the intermediate layer 20 in this exemplary embodiment adheres in a bonded manner to the upper face 11 of the cooling body 10. The intermediate layer 20 in this exemplary embodiment is a laminating film that is embodied by way of example from a synthetic material. The first face 21 of the intermediate layer 20 in this exemplary embodiment is laminated to the upper face 11 of the cooling body 10. The intermediate layer 20 in this exemplary embodiment is configured as one piece. The intermediate layer 20 may however also comprise by way of example multiple regions that are not connected to one another. The intermediate layer 20 in this exemplary embodiment lies with the first face 21 directly against the upper face 11 of the cooling body 10. The intermediate layer 20 in this exemplary embodiment lies with the second face 22 directly against the contact face 32 of the metal layer 30. The intermediate layer 20 in this exemplary embodiment is configured from the same material and in one piece in a direction perpendicular to the upper face 11 of the cooling body 10 continuously from the first face 21 to the second face 22.

The power module 1 comprises furthermore a layer having a metal layer 30 that is sub-divided into conductor track sections 31. The metal layer 30 that is sub-divided into conductor track sections 31 is produced from at least one metal sheet, which is sub-divided into conductor track sections 31, independently from the production of the intermediate layer 20 and independently from the production of the cooling body 10. In order to sub-divide the metal sheet, the conductor track sections 31 are stamped by way of example from the metal sheet with the result that the conductor track sections 31 are configured as stamped parts. Consequently, it is possible by way of example to produce, in particular stamp, multiple conductor track sections 31 from one metal sheet. The conductor track sections 31 may however also be produced from multiple metal sheets and subsequently brought together to form the metal layer 30. In this exemplary embodiment, the power module 1 comprises a plurality of conductor track sections 31. However, it is also possible to provide only one conductor track section 31. The conductor track sections 31 may be produced at least in part from one or multiple metals that have good electrical conductivity properties, such as by way of example copper or aluminum.

As illustrated in the figures, the conductor track sections 31 in this exemplary embodiment are configured in a planar manner. The conductor track sections 31 extend essentially in a planar manner by interpositioning the intermediate layer 20 on the upper face 11 of the cooling body 10. The conductor track sections 31 extend essentially in a planar manner in a common extension plane E of the metal layer 30. The metal layer 30 that is formed from the conductor track sections 31 consequently extends essentially in the extension plane E. The conductor track sections 31 may comprise connection regions 33 that are formed in one piece with the conductor track sections 31. The connection regions 33 are provided so as to provide an electrical contact between the power module 1 and components that are arranged outside the power module 1 and are not illustrated in the figures, such as by way of example an intermediate capacitor or an electric machine. The extension plane E in this exemplary embodiment is arranged in a plane parallel manner with respect to the upper face 11 of the cooling body 10 and with respect to the intermediate layer 20. The region of the conductor track sections 31 that does not form the connection regions 33 of the planar conductor track sections 31 is thus parallel with the upper face of the cooling body 10 and the intermediate layer 20.

The connection regions 33 may be arranged by way of example outside the extension plane E of the metal layer 30. The conductor track sections 31 may thus be formed in such a manner that the connection regions 33 protrude out of the extension plane E of the metal layer 30. By way of example, one connection region 33 of the conductor track sections 31 may be bent out of the extension plane E of the metal layer 30. In this exemplary embodiment, the connection regions 33 are bent out of the extension plane E in such a manner that they are perpendicular to the extension plane E of the metal layer 30. One connection region 33 of a conductor track section 31 may thus form an L-shaped profile with the region of the conductor track section 31 that extends in the extension plane E. The extension plane E of the metal layer 30 in this exemplary embodiment lies in a plane parallel manner with respect to the upper face 11 of the cooling body 10. With the exception of the connection regions 33 that are bent out of the extension plane E, the conductor track sections 31 in this exemplary embodiment consequently extend in the extension plane E of the metal layer 30.

The metal layer 30 is arranged on the second face 22 of the intermediate layer 20 and a contact face 32 is provided on the metal layer 30, said contact face facing the second face of the intermediate layer 20. The contact face 32 of the metal layer 30 in this exemplary embodiment adheres in a bonded manner to the second face 22 of the intermediate layer 20. The second face 22 of the intermediate layer 20 that is formed in this exemplary embodiment as a laminating film is laminated in this exemplary embodiment to the contact face 32 of the metal layer 30.

The power module 1 in this exemplary embodiment comprises furthermore electric and/or electronic power components 40 that are arranged on conductor track sections 31 of the metal layer 30 and are in electrical contact with conductor track sections 31 of the metal layer 30. In the case of the electric and/or electronic power components 40, the power semiconductors may be by way of example field effect transistors such as MIS-FETs (metal insulated semiconductor field effect transistor), IGBTs (insulated-gate bipolar transistor), power MOSFETs (metal oxide semiconductor field-effect transistor) and/or diodes, by way of example rectifier diodes. The power semiconductor may be by way of example a power semiconductor that does not have a housing (bare-die). Furthermore, the power module 1 may also comprise passive components such as by way of example resistors or capacitors. The electric and/or electronic components and/or electric and/or electronic power components 40 may be connected in an electrically conductive manner to one another or to other electric and/or electronic elements, which are arranged outside the power module 1 and are not illustrated in the figures, via the conductor track sections 31, via bonding wires or other suitable electrically conductive contact elements by way of example by means of a soldering or sintering process. The conductor track sections 31 in this exemplary embodiment are configured as conductor surfaces.

A method that may be used for producing a power module 1 comprises by way of example a step in which the metal layer 30 is sub-divided into conductor track sections 31. The process of sub-dividing said metal layer may be performed by virtue of stamping one or multiple conductor track sections 31 out of one or multiple metal sheets. The conductor track sections 31 may however also be produced by way of example using other technologies. Furthermore, the conductor track sections 31 may be bent. The conductor track sections 31 may thus be bent by way of example in such a manner that connection regions 33 of the conductor track sections 31 are bent at an angle with respect to other regions of the conductor track sections 31.

The method for producing the power module 1 comprises furthermore a step in which the metal layer 30 that is sub-divided into conductor track sections 31 is applied to the upper face 11 of the cooling body 10 by interpositioning the intermediate layer 20 that provides an adhesive bond. In a further step, the metal layer 30 that is sub-divided into conductor track sections 31 may be laminated to the cooling body 10 by interpositioning the intermediate layer 20 that provides an adhesive bond.

The method for producing the power module 1 comprises furthermore a step in which the at least one electric and/or electronic power component 40 is applied to the metal layer 30.

Furthermore, the method for producing the power module 1 comprises a step in which the at least one electric and/or electronic power component 40 is in electrical contact with at least one conductor track section 31 of the metal layer 30.

It goes without saying that other exemplary embodiments and mixed forms of the illustrated exemplary embodiments are also possible.

The invention claimed is:

1. A power module (1) comprising at least three layers that are stacked one above the other, the power module comprising:
    at least one cooling body (10) having an upper face (11),
    at least one intermediate layer (20) that is applied to the upper face (11) of the cooling body (10) and extends in a planar manner, wherein the intermediate layer is non-conductive, provides an adhesive bond and comprises a first face (21) that is facing the upper face (11)

of the cooling body (10) and a second face (22) that is remote from the first face (21), at least one metal layer (30) that is arranged on the second face (22) of the intermediate layer (20) and is sub-divided into conductor track sections (31), the conductor track sections (31) being spaced apart from each other, wherein the metal layer comprises a contact face (32) that faces the second face (22) of the intermediate layer (20), wherein the power module (1) furthermore comprises at least one electric and/or electronic power component (40) that is applied to at least one conductor track section (31) of the metal layer (30) and is in electrical contact with the at least one conductor track section (31) of the metal layer (30), characterized in that the metal layer (30) that is sub-divided into the conductor track sections (31) is produced from at least one metal sheet, which is sub-divided into conductor track sections (31), independently from the production of the intermediate layer (20) and independently from the production of the cooling body (10), wherein the first face of the intermediate layer (20) is laminated to the upper face (11) of the cooling body (10), wherein the second face (22) of the intermediate layer (20) is laminated to the contact face (32) of the metal layer (30), and wherein the intermediate layer (20) is configured as a laminating film that is embodied from a synthetic material.

2. The power module as claimed in claim 1 characterized in that the first face (21) of the intermediate layer (20) is adhered in a bonded manner to the upper face (11) of the cooling body (10).

3. The power module as claimed in claim 1, characterized in that the conductor track sections (31) are configured as stamped parts.

4. The power module as claimed in claim 1, characterized in that the conductor track section (31) comprises at least one connection region (33) so as to electrically contact the conductor track section (31), wherein the connection region (33) is arranged outside an extension plane (E) of the metal layer (30) in which the metal layer (30) essentially extends.

5. The power module as claimed in claim 4, characterized in that the connection region (33) of the conductor track section (31) is bent out of the extension plane (E) of the conductor track section (31).

6. The power module as claimed in claim 1, characterized in that the intermediate layer (20) is configured as one piece and that the intermediate layer (20) lies with the first face (21) directly against the upper face (11) of the cooling body (10) and the intermediate layer (20) lies with the second face (22) directly against the contact face (32) of the metal layer (30).

7. A method for producing a power module (1) as claimed in claim 1, wherein the method comprises the following steps:

producing the metal layer (30) from the at least one metal sheet, sub-dividing the metal layer (30) into the circuit track sections (31) independently from the production of the intermediate layer (20) and independently from the production of the cooling body (10), thereafter applying the metal layer (30) that is sub-divided into circuit track sections (31) to the upper face (11) of the cooling body (10) by interpositioning the intermediate layer (20) that provides the adhesive bond, the applying the metal layer (30) including laminating the metal layer (30) with the intermediate layer (20) on the cooling body (10), attaching the at least one electronic power component (40) to the at least one circuit track section (31) of the metal layer (30), and providing electrical contact between the electronic power component (40) and the at least one circuit track section (31) of the metal layer (30).

8. The power module as claimed in claim 2 characterized in that the second face (22) of the intermediate layer (20) adheres in a bonded manner to the contact face (32) of the metal layer (30).

9. The power module as claimed in claim 1 characterized in that the second face (22) of the intermediate layer (20) adheres in a bonded manner to the contact face (32) of the metal layer (30).

10. The power module as claimed in claim 1, characterized in that the second face (22) of the intermediate layer (20) is laminated to the contact face (32) of the metal layer (30).

* * * * *